(12) United States Patent

Heijne et al.

(10) Patent No.: US 12,677,057 B2
(45) Date of Patent: Jul. 7, 2026

(54) FLEXIBLE CONNECTOR WITH REDUCED TORSIONAL STIFFNESS

(71) Applicant: CAMBRIDGE MECHATRONICS LIMITED, Cambridge (GB)

(72) Inventors: Nicolas Heijne, Cambridge (GB); Andrew Benjamin Simpson Brown, Cambridge (GB); Chris Wiseman, Cambridge (GB); Peter Van Wyk, Cambridge (GB); Joshua Carr, Cambridge (GB); Stephen Matthew Bunting, Cambridge (GB)

(73) Assignee: CAMBRIDGE MECHATRONICS LIMITED, Cambridge (GB)

( * ) Notice: Subject to any disclaimer, the term of this patent is extended or adjusted under 35 U.S.C. 154(b) by 115 days.

(21) Appl. No.: 18/291,125

(22) PCT Filed: Jul. 22, 2022

(86) PCT No.: PCT/GB2022/051931
§ 371 (c)(1),
(2) Date: Jan. 22, 2024

(87) PCT Pub. No.: WO2023/002216
PCT Pub. Date: Jan. 26, 2023

(65) Prior Publication Data
US 2024/0364993 A1 Oct. 31, 2024

(30) Foreign Application Priority Data

Jul. 22, 2021 (GB) ...................................... 2110585
May 16, 2022 (GB) ...................................... 2207111

(51) Int. Cl.
*H04N 23/57* (2023.01)
*G09G 3/00* (2006.01)
(Continued)

(52) U.S. Cl.
CPC ............. *H04N 23/57* (2023.01); *G09G 3/005* (2013.01); *H04N 23/54* (2023.01);
(Continued)

(58) Field of Classification Search
None
See application file for complete search history.

(56) References Cited

U.S. PATENT DOCUMENTS

2006/0033832 A1* 2/2006 Shin ........................ H04N 23/51
348/E5.026
2007/0077805 A1 4/2007 Nomura et al.
(Continued)

FOREIGN PATENT DOCUMENTS

CN 103688217 B 8/2016
CN 209102989 U 7/2019
(Continued)

OTHER PUBLICATIONS

GB Search and Examination Report of GB Application No. 2110585.3 dated Jul. 22, 2022.
(Continued)

*Primary Examiner* — Paul M Berardesca
(74) *Attorney, Agent, or Firm* — Van Hoven PC; Stefan D. Osterbur; Joshua Van Hoven

(57) ABSTRACT

An apparatus comprising: a support structure; a movable part comprising an electronic component, wherein a primary axis is defined with reference to the support structure and passes through the electronic component; an actuator assembly configured to move the movable part relative to the support structure; and a flexible connector for making electrical connections to the electronic component.

20 Claims, 11 Drawing Sheets

(51) Int. Cl.
  *H04N 23/54* (2023.01)
  *H04N 23/68* (2023.01)
  *H05K 1/02* (2006.01)

(52) U.S. Cl.
  CPC .......... *H04N 23/687* (2023.01); *H05K 1/028*
    (2013.01); *H05K 2201/052* (2013.01); *H05K*
    *2201/053* (2013.01); *H05K 2201/055*
    (2013.01); *H05K 2201/056* (2013.01)

(56) References Cited

U.S. PATENT DOCUMENTS

| | | | |
|---|---|---|---|
| 2009/0201399 A1 | 8/2009 | Senga | |
| 2014/0184891 A1* | 7/2014 | Lee | H04N 23/67 |
| | | | 348/357 |
| 2018/0284476 A1* | 10/2018 | Minamisawa | H05K 1/0281 |
| 2019/0018258 A1 | 1/2019 | Minamisawa et al. | |
| 2020/0012068 A1* | 1/2020 | Lim | H05K 1/181 |
| 2020/0192078 A1* | 6/2020 | Spring | H05K 1/189 |
| 2020/0329179 A1 | 10/2020 | Yeh et al. | |
| 2021/0084202 A1* | 3/2021 | Xuepeng | H05K 1/028 |
| 2021/0092297 A1 | 3/2021 | Smyth et al. | |
| 2021/0203815 A1* | 7/2021 | Kim | H04N 23/54 |
| 2021/0251080 A1* | 8/2021 | Minamisawa | H05K 1/028 |
| 2021/0251081 A1* | 8/2021 | Kimura | G03B 5/00 |
| 2021/0251082 A1* | 8/2021 | Ono | G03B 5/00 |
| 2022/0091476 A1* | 3/2022 | Minamisawa | H04N 23/54 |
| 2022/0091477 A1* | 3/2022 | Minamisawa | H04N 23/57 |
| 2022/0272264 A1* | 8/2022 | Horio | H05K 1/028 |
| 2022/0385815 A1* | 12/2022 | Sazai | H05K 1/189 |
| 2024/0040219 A1* | 2/2024 | Xu | H05K 1/028 |
| 2024/0147071 A1* | 5/2024 | Kim | H04N 23/67 |

FOREIGN PATENT DOCUMENTS

| | | | |
|---|---|---|---|
| EP | 3641293 A1 | 4/2020 | |
| KR | 20210059681 A | 5/2021 | |
| WO | 2020145650 A1 | 7/2020 | |

OTHER PUBLICATIONS

International Search Report and Written Opinion of PCT/GB2022/051931 dated Jan. 13, 2023.

* cited by examiner

FLEXIBLE CONNECTOR WITH REDUCED TORSIONAL STIFFNESS

CROSS-REFERENCE TO RELATED APPLICATIONS

This application is a national stage application under 35 U.S.C. § 371 of International Application No. PCT/GB2022/051931, filed Jul. 22, 2022, which claims priority of GB Patent Application Nos. 2110585.3, filed Jul. 22, 2021, and 2207111.2, filed May 16, 2022, the disclosures of each of which are hereby incorporated by reference herein in their entireties.

FIELD

The present application relates to an apparatus (e.g. a camera assembly). Particularly an apparatus comprising a movable part which comprises an electronic component (e.g. an image sensor), a support structure, an actuator assembly configured to move the movable part relative to the support structure, and a flexible connector for making electrical connections to the electronic component.

BACKGROUND

Such an apparatus may be applied in a variety of devices including handheld devices such as mobile phones and wearable devices such as augmented reality (AR) glasses.

Such an apparatus may be employed in a camera assembly for example to provide a camera capable of providing optical image stabilisation (OIS). In such an embodiment, the electronic component may comprise an image sensor. For example, OIS may be provided by having the actuator assembly configured to rotate the image sensor (or a camera module comprising the image sensor) about an axis perpendicular to the light-sensitive surface/region of the image sensor (herein also referred to as the 'primary sensor axis'). This method of providing OIS is herein also referred to as 'sensor-rotation OIS'. Alternatively or additionally, OIS may be provided by having the actuator assembly configured to tilt the image sensor (or the camera module comprising the image sensor) about a first and/or second axes (herein also referred to 'tilt axes') which are perpendicular to each other and perpendicular to a primary axis. This method of providing OIS is herein also referred to as 'sensor-tilt OIS'. The primary axis may be defined with reference to the support structure of the camera assembly. The primary axis may also be an axis which aligns with the primary sensor axis when the image sensor is not tilted.

WO2011/104518A discloses an actuator assembly capable of providing such sensor-rotation OIS and sensor-tilt OIS.

Such an apparatus may comprise a flexible connector mechanically and electrically connected at one end to the movable part (e.g. the image sensor, or the camera module comprising the image sensor). The stiffness of the flexible connector may resist desirable movement of the movable part. For example, the flexible connector may provide resistance to the image sensor being rotated about the primary sensor axis and/or the image sensor being tilted about the first and/or second tilt axes.

For sensor-rotation OIS, it is desirable that the torsional stiffness of the flexible connector about the primary axis is as low as possible. Similarly, for sensor-tilt OIS, it is desirable that the torsional stiffness of the flexible connector about the first and/or second axes is as low as possible.

Similarly, the apparatus may be employed in a device in which a display or a light source is moved. Specifically, the movable part may comprise a display or an emitter. The display or light source (otherwise referred to as an emitter or an illumination source) may be moved for the purpose of wobulation, for example, for the display of a super-resolution image (i.e. an image having a resolution higher than that of the intrinsic resolution of the emitter or display). In this case, a high-resolution image is displayed (or projected) by displaying a number of lower-resolution images at different positions in rapid succession. The image displayed at each position is a lower-resolution image formed of a subset of pixels of the high-resolution image. The movable part may be moved between the positions in a repeated pattern at a high frequency, for example greater than 30 Hz, preferably greater than 60 Hz, further preferably greater than 120 Hz. The succession of lower-resolution images is thus perceived by the human eye as one high-resolution image. Such an apparatus may comprise a flexible connector mechanically and electrically connected at one end to the movable part (e.g. the display or emitter). The stiffness of the flexible connector may resist desirable movement of the movable part.

The apparatus may also be employed in a system with 3D sensing capabilities, in which a light source is moved. Such a system is described in WO2020/030916, which is incorporated herein by reference in its entirety. In these embodiments, the movable part comprises a light source (otherwise referred to as an emitter or an illumination source) and the apparatus may comprise a flexible connector mechanically and electrically connected at one end to the movable part (e.g. the display or emitter). The stiffness of the flexible connector may resist desirable movement of the movable part.

In any of the applications, the electronic component may be rotated about the primary axis or an axis parallel to the primary axis. Alternatively or additionally, the actuator assembly may be configured to tilt the electronic component about a first and/or second axes (herein also referred to 'tilt axes') which are perpendicular to each other and perpendicular to the primary axis (the primary axis being defined with reference to the support structure of the apparatus).

Apparatuses comprising such flexible connectors with features that help reduce the torsional stiffness experienced by the movable part about the primary axis and/or about the first and/or second tilt axes will now be described.

SUMMARY OF INVENTION

According to the present invention, there is provided an apparatus comprising: a support structure; a movable part comprising an electronic component, wherein a primary axis is defined with reference to the support structure and passes through the electronic component; an actuator assembly configured to move the movable part relative to the support structure; and a flexible connector for making electrical connections to the electronic component. The flexible connector comprises: a first portion connected at one end to the movable part and passing between the movable part and the support structure, below the electronic component with respect to the primary axis; and a second portion extending from the first portion, and located outside the footprint of the movable part as viewed along the primary axis. In order to reduce the torsional stiffness of the flexible connector: the first portion comprises one or more bends, each about (i.e. around) an axis at least substantially parallel (e.g. parallel, generally parallel, or primarily parallel) to the primary axis;

and/or the second portion comprises one or more bends, each about (i.e. around) an axis at least substantially perpendicular (e.g. perpendicular, generally perpendicular, or primarily perpendicular) to the primary axis.

The primary axis may pass through the electronic component throughout the operating range of movement of the electronic component.

The flexible connector may comprise a flexible circuit. For example, it may comprise a flexible printed circuit (FPC) or a flat flexible cable (FFC). The flexible connector may be described as a flat flexible connector.

The bends of the first portion and the second portion may comprise 3-point or 4-point saddle bends, U-shaped bends, and/or sharp bends.

As mentioned above, the first portion of the flexible connector passes between the movable part and the support structure, below the electronic component with respect to the primary axis. In other words, the electronic component may comprise a first side and a second side, wherein the second side is opposite to the first side and is displaced from the first side along the primary axis. The first and second sides may be two faces of the electronic component which are perpendicular or at least substantially perpendicular (e.g. perpendicular, generally perpendicular, or primarily perpendicular) to the primary axis.

Optionally, the first portion comprises a first bend about (i.e. around) an axis at least substantially parallel (e.g. parallel, generally parallel, or primarily parallel) to the primary axis, and a second bend about another axis at least substantially parallel (e.g. parallel, generally parallel, or primarily parallel) to the primary axis; wherein the first and second bends bend about their respective axes in opposite senses. In other words, the first bend bends in a clockwise direction about its respective axis and the second bend bends in a counter-clockwise direction about its respective axis, or vice versa.

Optionally, the second portion comprises two bends, each about (i.e. around) an axis at least substantially perpendicular (e.g. perpendicular, generally perpendicular, or primarily perpendicular) to the primary axis.

Optionally, the actuator assembly is configured to rotate the movable part about a first and/or second axes, wherein the first and second axes are perpendicular to each other and to the primary axis. Moreover, the flexible connector may have a stiffness of less than 0.64 Nmm/degree in relation to rotations of the movable part about the first and/or second axes within an operating range.

The flexible connector may have a stiffness of less than 0.58 Nmm/degree, less than 0.28 Nmm/degree, less than 0.18 Nmm/degree, less than 0.14 Nmm/degree, less than 0.04 Nmm/degree, or less than 0.018 Nmm/degree in relation to rotations of the movable part about the first and/or second axes within an operating range. The flexible connector may have a stiffness of about 0.002 Nmm/degree in relation to rotations of the movable part about the first and/or second axes within an operating range.

A neutral axis of the flexible connector may pass through, or proximate to, a plane defined by the first and second axes.

Optionally, the actuator assembly is configured to rotate the movable part about the primary axis. Moreover, the flexible connector may have a stiffness of less than 4.5 Nmm/degree in relation to rotations of the movable part about the primary axis within an operating range.

The flexible connector may have a stiffness of less than 2.5 Nmm/degree in relation to rotations of the movable part about the primary axis within an operating range. The flexible connector may have a stiffness of about 0.37 Nmm/ degree in relation to rotations of the movable part about the primary axis within an operating range.

Optionally, the apparatus may comprise a lens assembly positioned above the electronic component with respect to the primary axis. The actuator assembly may be configured to rotate the movable part about the primary axis and/or about an optical axis of the lens assembly.

The lens assembly may comprise a lens element which is configured to move parallel to the optical axis, for example to provide focusing of an image formed on an image sensor, for example, as part of an autofocus (AF) function.

Optionally, at least part of the flexible connector is divided into a plurality of legs. The flexible connector may be divided into an even number of legs. For example, 2 legs or 4 legs. The plurality of legs may be spaced apart from each other.

Optionally, the plurality of legs comprises a first leg and a second leg, wherein the first leg is at least substantially a horizontally or vertically flipped version of the second leg as viewed along the primary axis. In other words, the first leg is a mirrored version of the second leg as viewed along the primary axis. The plurality of legs may also comprise a first set or pair of legs and a second set or pair of legs, wherein the first set or pair of legs is at least substantially a horizontally or vertically flipped version of the second set or pair of legs as viewed along the primary axis. In other words, the first set or pair of legs is a mirrored version of the second set or pair of legs as viewed along the primary axis. The first set or pair of legs may comprise half of the plurality of legs, and the second set or pair of legs may comprise the other half of the plurality of legs.

Optionally, as the first portion passes between the movable part and the support structure, below the electronic component with respect to the primary axis, the major surfaces (i.e. the upward-facing and downward-facing surfaces) of the first portion are at least substantially perpendicular (e.g. perpendicular, generally perpendicular, or primarily perpendicular) to the primary axis. For example, normal(s) to the major surfaces may be at a shallow angle (e.g. of less than 45 degrees) to the primary axis.

Optionally, the first portion (generally) extends from the movable part in a first direction and then bends around (e.g. downwards) to (generally) extend in a second direction which is (at least substantially) opposite to the first direction. The first direction and second direction may be perpendicular to the primary axis.

A bend may be a fold and/or a curve. Moreover, the flexible connector (e.g. the first portion of the flexible connector) may be divided into the above-mentioned plurality of legs after it bends around to extend in the second direction.

Optionally, as viewed along the primary axis, the first portion extends in a serpentine manner.

Optionally, as viewed along the primary axis, the first portion follows a narrowing serpentine path inwards and then follows a widening serpentine path outwards.

Optionally, as viewed along the primary axis, the first portion spirals inward in a first sense around the primary axis or an axis parallel thereto, and then spirals outward in a second, opposite sense.

The first portion of the flexible connection may have a two-fold rotational symmetry about the primary axis. The plurality of legs of the flexible connection may be arranged with a two-fold rotational symmetry about the primary axis.

Optionally, as the first portion extends from the movable part to the second portion, the first portion slopes downward (i.e. away from the electronic component and/or the movable part).

Optionally, as the second portion extends from the first portion to its outer end, the second portion bends upwards or downwards, and then bends outwards (i.e. at least party away from the primary axis).

Optionally, as the second portion extends from the first portion to its outer end, the second portion bends upwards, bends downwards and then bends outwards. Alternatively, the second portion may instead bend downwards, bend upwards and then bend outwards. Moreover, the second portion may extend sideways between the upwards bend and the downwards bend.

Optionally, as the second portion extends from the first portion to its outer end, the second portion bends outwards after an upwards or downwards return bend. A return bend may be an at least substantially U-shaped or V-shaped bend.

Optionally, the second portion bends upwards, wraps at least partly around the periphery of the movable part as viewed along the primary axis, and then bends outwards after a downwards return bend.

Optionally, the apparatus comprises a (rigid) printed circuit board (PCB) to which the second portion (e.g. the outer end of the second portion) is operatively connected to (e.g. mechanically and electrically connected to), wherein the PCB is oriented such that the major surfaces thereof are at least substantially parallel (e.g. parallel, generally parallel, or primarily parallel) to the primary axis. The PCB may be positioned outside the footprint of the movable part as viewed along the primary axis, e.g. adjacent the movable part. The PCB may be mounted on a side wall of the support structure. Moreover, optionally, as the second portion extends from the first portion to its outer end, the second portion bends upwards and then is connected to the PCB. Moreover, optionally, after bending upwards, the second portion bends downwards to connect to the PCB; or, after bending upwards, the second portion bends sideways to connect to the PCB.

Optionally, the apparatus comprises one or more further flexible connectors each operatively connected to the PCB at a first end and operatively connected to a further (rigid) PCB at a second end. The further PCB may be mounted on a side wall of the support structure.

Optionally, the one or more further flexible connectors each comprise one or more bends, each about an axis at least substantially parallel (e.g. parallel, generally parallel, or primarily parallel) to the primary axis.

Optionally, the major surfaces of the one or more further flexible connectors are at least substantially parallel (e.g. parallel, generally parallel, or primarily parallel) to the primary axis.

Optionally, the further PCB is oriented such that the major surfaces thereof are at least substantially parallel (e.g. parallel, generally parallel, or primarily parallel) to the primary axis. The major surfaces of the PCB may be at least substantially parallel (e.g. parallel, generally parallel, or primarily parallel) to the major surfaces of the further PCB.

Optionally, the one or more further flexible connectors are folded onto itself one or more times as viewed along the primary axis.

Optionally, the one or more further flexible connectors comprise a first further flexible connector and a second further flexible connector; and wherein the first further flexible connector is a mirrored version of the second further flexible connector as viewed along the primary axis. The first and second further flexible connectors may be connected to opposite sides of the PCB and may also be connected to opposite sides of the further PCB.

Optionally, the actuator assembly comprises one or more shape memory alloy (SMA) wires operatively connected (e.g. mechanically and electrically connected) between the support structure and the movable part.

For example, the actuator assembly may comprise eight SMA wires divided in two groups of four SMA wires, wherein: two SMA wires are located on each of four sides around the primary axis, the four sides extending in a loop around the primary axis; the two SMA wires on each of the four sides are inclined with respect to the primary axis; and one of the two groups of four SMA wires provides a force on the movable part with a component in a first direction along the primary axis and the other of the two groups of four SMA wires provides a force on the movable part with a component in a second direction along the primary axis, opposite to the first direction along the primary axis. The SMA wires of each of the two groups of four SMA wires may be arranged with a two-fold rotational symmetry about the primary axis.

For example, the movable part may be movable relative to the support structure across a range of movement in two orthogonal directions perpendicular to the primary axis; and the actuator assembly may comprise four SMA wires, wherein none of the SMA wires are collinear and the SMA wires are capable of being selectively driven to move the movable part relative to the support structure to any position in said range of movement without applying any net torque to the movable part in the plane of the two orthogonal directions around the primary axis.

For example, the actuator assembly may comprise four SMA wires and a biasing element arranged to resist translation of the movable part in a plane perpendicular to the primary axis.

The camera assembly may comprise a bearing arrangement that supports the movable part on the support structure, e.g. a pivot bearing. The first portion of the flexible connector (e.g. its plurality of legs) may wrap around the bearing arrangement as it passes between the movable part and the support structure, below the electronic component with respect to the primary axis.

Optionally, the electronic component may comprise an image sensor (or the electronic component may be an image sensor) having a light-sensitive region. The apparatus may further comprise a lens assembly to provide focusing of an image formed on an image sensor, for example, as part of an autofocus (AF) function. The lens assembly may be positioned above the image sensor with respect to the primary axis. The flexible connector may make electrical connections to the image sensor, wherein the first portion passes between the movable part and the support structure, below the image sensor with respect to the primary axis (e.g. between a first side of the movable component and the support structure). The first side of the movable component may refer to the side of the movable component opposite to that on which the light-sensitive region of the image sensor is disposed. The primary axis may be perpendicular to a plane in which the light-sensitive region of the image sensor is disposed (when the movable part is in a neutral position).

Optionally, the electronic component may comprise a display (or the electronic component may be a display). The display may be a display panel, for example a LCOS (liquid crystal on silicon) display, a MicroLED display, a digital micromirror device (DMD) or a laser beam scanning (LBS) system. The flexible connector may make electrical connections to the display, wherein the first portion passes between the movable part and the support structure, below the display with respect to the primary axis (e.g. between a first side of the movable component and the support structure). The first side of the movable component may refer to the side of the movable component opposite to that from which light is emitted by the display.

As mentioned above, a primary axis is defined with reference to the support structure. In the case that the movable assembly comprises a display, the display may define a plane and the primary axis may be perpendicular to the plane defined by the display. In any case, the primary axis may be aligned with a general direction in which light is emitted from the display (when the movable part is in a neutral position).

Optionally, the electronic component may comprise an emitter (or the electronic component may be an emitter). The emitter is configured to emit radiation (visible light or non-visible radiation, e.g. near infrared (NIR) light, short-wave infrared (SWIR) light). The emitter may comprise one or more LEDs or lasers, for example VCSELs (vertical-cavity surface-emitting lasers) or edge-emitting lasers. The emitter may comprise a VCSEL array. The emitter may otherwise be referred to as an illumination source and/or may comprise an image projector. The flexible connector may make electrical connections to the emitter, wherein the first portion passes between the movable part and the support structure, below the emitter with respect to the primary axis (i.e. between a first side of the movable component and the support structure). The first side of the movable component may refer to the side of the movable component opposite to that from which light is emitted by the emitter.

As mentioned above, a primary axis is defined with reference to support structure. In the case that the movable assembly comprises an emitter, the emitter may define a plane and the primary axis may be perpendicular to the plane defined by the emitter (when the movable part is in a neutral position). For example, the emitter may comprise a VCSEL array and the primary axis may be perpendicular to the plane of the VCSEL array. In any case, the primary axis may be aligned with a general direction in which radiation is emitted by the emitter.

Equally, the electronic component may be any other component which requires electrical connections for the transfer of power and/or data. The electronic component may comprise a variable aperture mechanism (otherwise referred to as an iris), for example. The electronic component may comprise all or merely a part of any of the example electronic components listed here.

Optionally, the first portion comprises one or more bends, each about (i.e. around) an axis at least substantially perpendicular (e.g. perpendicular, generally perpendicular, or primarily perpendicular) to the primary axis.

Optionally, the first portion is folded onto itself (i.e. bent over upon itself, or folded back on itself) one or more times as viewed across the primary axis (e.g. after the first portion bends around to extend in the second direction).

Optionally, (e.g. after the first portion bends around to extend in the second direction) the first portion extends downwards helically around the primary axis (i.e. following a helical path extending along the primary axis) as it extends from the movable part.

Optionally, the first portion, as it extends from the movable part, bends upwards and then downwards before extending below the electronic component. As shown in FIG. 27, the first portion may extend significantly upwards.

Optionally, the first portion, as it extends from the movable part to the second portion, extends from one or more sides of the movable part (away from the primary axis), bends upwards (generally parallel to the primary axis), wraps at least partly around the periphery of the movable part as viewed along the primary axis (i.e. wraps around the periphery of the movable part around the primary axis), and then bends downwards (generally parallel to the primary axis) and inwards (i.e. towards the primary axis) to pass between the movable part and the support structure, below the image sensor with respect to the primary axis. As shown in FIGS. 28 and 29, the first portion may comprise two arms that extend from two opposite sides of the movable part. Each arm extends from a side of the movable part, bends upwards, wraps at least partly around the periphery of the movable part as viewed along the primary axis, and then bends downwards and inwards to pass between the movable part and the support structure, below the image sensor with respect to the primary axis. The arms may join after wrapping around the movable part and before bending downwards and inwards to pass between the movable part and the support structure, below the image sensor with respect to the primary axis.

BRIEF DESCRIPTION OF THE DRAWINGS

Certain embodiments of the present invention will now be described, by way of example only, with reference to the accompanying drawings, in which.

DETAILED DESCRIPTION

Camera

Figure 1:
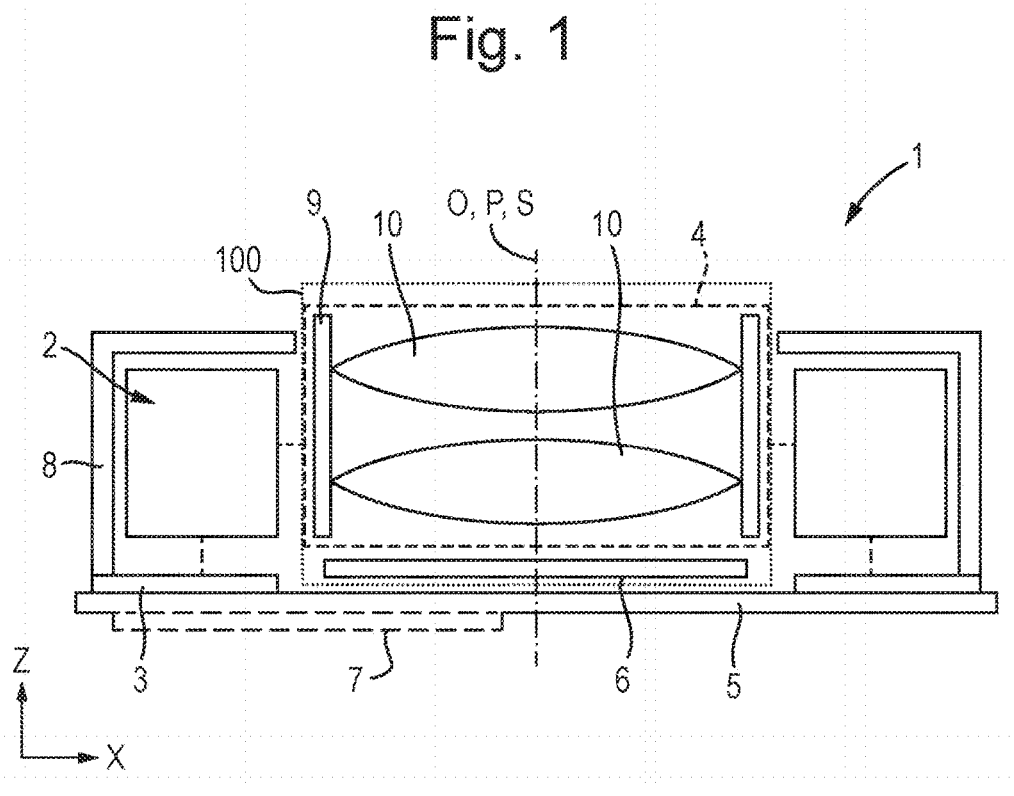
FIG. 1 is schematic diagram of a camera assembly incorporating an actuator assembly.

FIG. 1 is a schematic diagram of a camera assembly 1. The camera assembly 1 includes a movable camera module 100, a support structure 3, and an actuator assembly 2. The support structure 3 includes a base 5. The camera module 100 comprises an image sensor 6 and a lens assembly 4. The camera assembly 1 also includes an actuator assembly 2 configured to move the camera module 100 relative to the support structure 3. Thus the camera module 100 can also be described as a movable part 100 of the camera assembly 1 which is configured to move relative to the support structure 3. The actuator assembly 2 may be an SMA actuator assembly comprising SMA wires, a voice coil motor (VCM) actuator assembly, or any other suitable type of actuator assembly.

The lens assembly 4 is positioned above the image sensor 6 with respect to a primary axis P of the camera assembly 1. The image sensor 6 is disposed in front of a front side of the base 5, i.e., the image sensor 6 is interposed between the lens assembly 4 and the base 5.

The primary axis P is defined with reference to the support structure 3 and is at least substantially perpendicular (e.g. perpendicular, generally perpendicular, or primarily perpendicular) to the major surfaces of the base 5. As shown in FIG. 1, the primary axis P aligns with an optical axis O of the lens assembly 4 when the lens assembly 4 is not tilted/rotated about a first and/or second axes (herein also referred to as the 'first and/or second tilt axes'), wherein the first and second axes are perpendicular to each other and to the primary axis.

The camera assembly 1 includes an integrated circuit (IC) 7, which implements a control circuit, and also a gyroscope sensor (not shown). The support structure 3 also includes a can 8 which protrudes forwardly from the base 5 to encase and protect the other components of the camera assembly 1.

The lens assembly 4 includes a lens carriage 9 in the form of a cylindrical body supporting two lenses arranged along the optical axis O. In general, any number of one or more lenses 10 may be included. The camera assembly 1 may be comprised in a camera, which may be referred to as a miniature camera.

The lens assembly 4 is arranged to focus an image onto the image sensor 6. The image sensor 6 captures the image and may be of any suitable type, for example, a charge-coupled device (CCD) or a complementary metal-oxide-semiconductor (CMOS) device.

The lenses 10 are supported on the lens carriage 9. Although all the lenses 10 are fixed to the lens carriage 9 in this example, the lens carriage 9 may include an actuator assembly (not shown) configured to move at least one of the lenses 10 along the optical axis O relative to the image sensor 6, for example to provide autofocusing (AF) or zoom. Such an actuator assembly is herein also referred to as an 'AF actuator assembly'.

The actuator assembly 2 is configured to rotate the camera module 100 about the first and/or second tilt axes. The actuator assembly 2 is also configured to rotate the camera module 100 about an axis S (herein also referred to as the 'primary sensor axis') which is perpendicular to the light-sensitive surface/region of the image sensor 6 and passes through the centre of the image sensor 6. Such rotations can be used to provide optical image stabilisation (OIS). Examples of actuator assemblies capable of providing some or all of these rotations are described in WO 2011/104518 A1, WO 2013/175197 A1, and WO 2020/074899 A1 which are incorporated herein by reference.

Here, the primary sensor axis S is always aligned with the optical axis O as the position of the lens assembly 4 is fixed laterally in relation to the image sensor 6, but this may not be the case in alternative embodiments—for example, where the lens assembly 4 is configured to move laterally relative to the image sensor 6. As shown in FIG. 1, the primary sensor axis S aligns with the primary axis P and the optical axis O, when the camera module 100 is untilted and laterally centred.

Flexible Connector

The camera assembly 1 comprises a flexible connector 20 for making electrical connections to the image sensor 6, and optionally other components of the camera module 100 such as the AF actuator assembly (if one is provided). The flexible connector 20 may be a flexible circuit such as a flexible printed circuit (FPC) or a flat flexible cable (FFC). The flexible connector 20 may be described as a flat flexible connector 20 comprising two opposite major surfaces.

The flexible connector 20 has a first portion that is connected at one end to a base 60 of the camera module 100 on which the image sensor 6 is mounted. The first portion passes between the camera module 100 and the support structure 3, below the camera module 100 with respect to the primary axis P. In other words, the first portion passes underneath the movable part 100 such that the first portion overlaps with the movable part 100 as viewed along the primary axis P. The first portion may be located within the footprint of the movable part 100 as viewed along the primary axis P.

The flexible connector 20 also has a second portion extending from the first portion, and located outside the footprint of the camera module 100 as viewed along the primary axis P.

As described above, the stiffness of the flexible connector 20 may resist desirable movement of the camera module 100. For example, the flexible connector 20 may provide resistance to the camera module 100 (and thus the image sensor 6) being rotated about the primary sensor axis S. The flexible connector 20 may also resist camera module 100 (and thus the image sensor) being rotated about the first and/or second tilt axes. As discussed above, both of these rotations are desirable for OIS.

FIGS. 2 to 22 show flexible connectors 20 comprising features in the first portion and features in the second portion that help reduce torsional stiffness of the flexible connector 20 in relation to rotations of the camera module 100 about the primary sensor axis S and/or about the first and/or second tilt axes.

As the first portion of the flexible connectors 20 of FIGS. 2 to 22 passes between the camera module 100 and the support structure 3, below the image sensor 6 with respect to the primary axis P, the major surfaces of the first portion are at least substantially perpendicular (e.g. perpendicular, generally perpendicular, or primarily perpendicular) to the primary axis P. For example, normal(s) to the major surfaces of the first portion are at a shallow angle e.g. of less than 45 degrees to the primary axis P.

As the first portion of the flexible connectors 20 of FIGS. 2 to 22 extends from the camera module 100 to the second portion, the first portion slopes downward, i.e. slopes away from the image sensor 6.

Features of the First Portion

The first portion of the flexible connectors 20 of e.g. FIGS. 2 to 12 all have one or more bends, each about an axis substantially parallel (e.g. parallel, generally parallel, or primarily parallel) to the primary axis P. These bends help reduce the torsional stiffness of the flexible connectors 20.

The first portion of the flexible connectors 20 of FIGS. 2 to 9, extend from a lateral side of the base 60 in a first direction and then bend around to extend in a second direction which is substantially opposite to the first direction. The first direction and second direction are perpendicular to the primary axis P as viewed across the primary axis P. The lateral side from which the flexible connectors 20 extend is at least substantially parallel (e.g. parallel, generally parallel, or primarily parallel) to the primary axis P. The flexible connectors 20 extend from a central portion of the lateral side of the base 60.

After bending around, the flexible connector 20 of FIGS. 2-8 are divided into a plurality of spaced-apart legs. The plurality of legs of FIGS. 2 to 9 comprise bends, each about an axis substantially parallel (e.g. parallel, generally parallel, or primarily parallel) to the primary axis P (for ease of reference, hereinafter also referred to as 'XY-plane bends'). The XY-plane bends help reduce the torsional stiffness of the flexible connectors 20. The XY-plane bends of FIGS. 2-9 could be described as 3-point or 4-point saddle bends, substantially U-shaped bends, and/or return bends.

The flexible connectors 20 of FIGS. 2 to 5 are divided into two legs.

Figure 2:
FIG. 2 is a side view of a flexible connector attached to a movable part.
Figure 3:
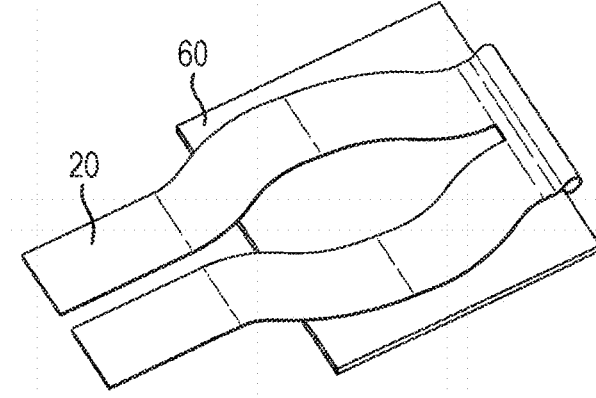
FIG. 3 is a bottom perspective view of in the flexible connector and movable part of FIG. 2.

The flexible connector 20 of FIGS. 2 and 3 has a torsional stiffness of about 0.64 Nmm/degrees in relation to rotations of the camera module 100 about the first and/or second tilt axes within an operating range.

Figure 4:
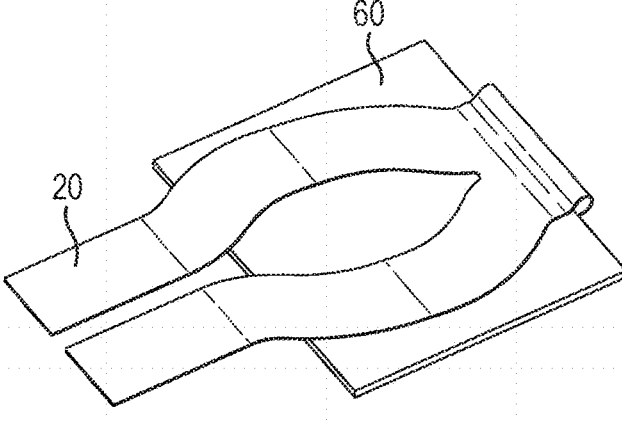
FIG. 4 is a bottom perspective view of a flexible connector attached to a movable part.

Compared to the flexible connector 20 of FIG. 3, the flexible connector 20 of FIG. 4 has a decreased width where it joins. As a result of this, the flexible connector 20 of FIG. 4 has a lower torsional stiffness of about 0.58 Nmm/degrees in relation to rotations of the camera module 100 about the first and/or second tilt axes within an operating range.

Figure 5:
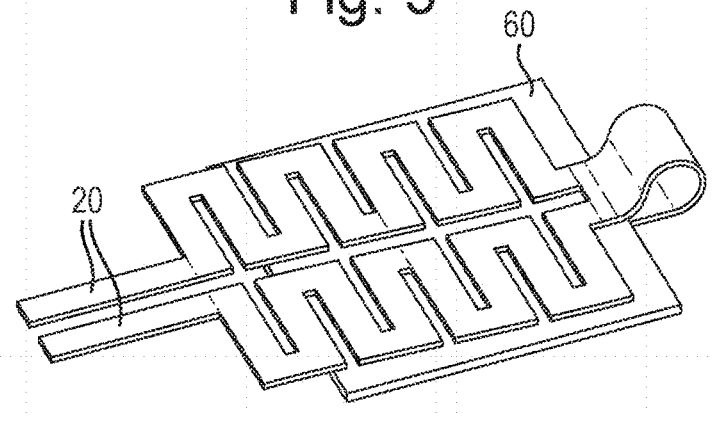
FIG. 5 is a bottom perspective view of a flexible connector attached to a movable part.

The flexible connector 20 of FIG. 5 is thicker but narrower than the flexible connectors 20 of FIGS. 2-4. Thus it also has narrower legs. This allows the legs to have more XY-plane bends, which helps reduce the torsional stiffness. Due to the large number of bends, the flexible connector 20 of FIG. 5 has a torsional stiffness of about 0.04 Nmm/degrees in relation to rotations of the camera module 100 about the first and/or second tilt axes within an operating range. However, because the flexible connector 20 of FIG. 5 is thicker, a larger bend radius is required to fold the flexible connector 20 under the base 60.

Figures 6, 7, 8, 9:
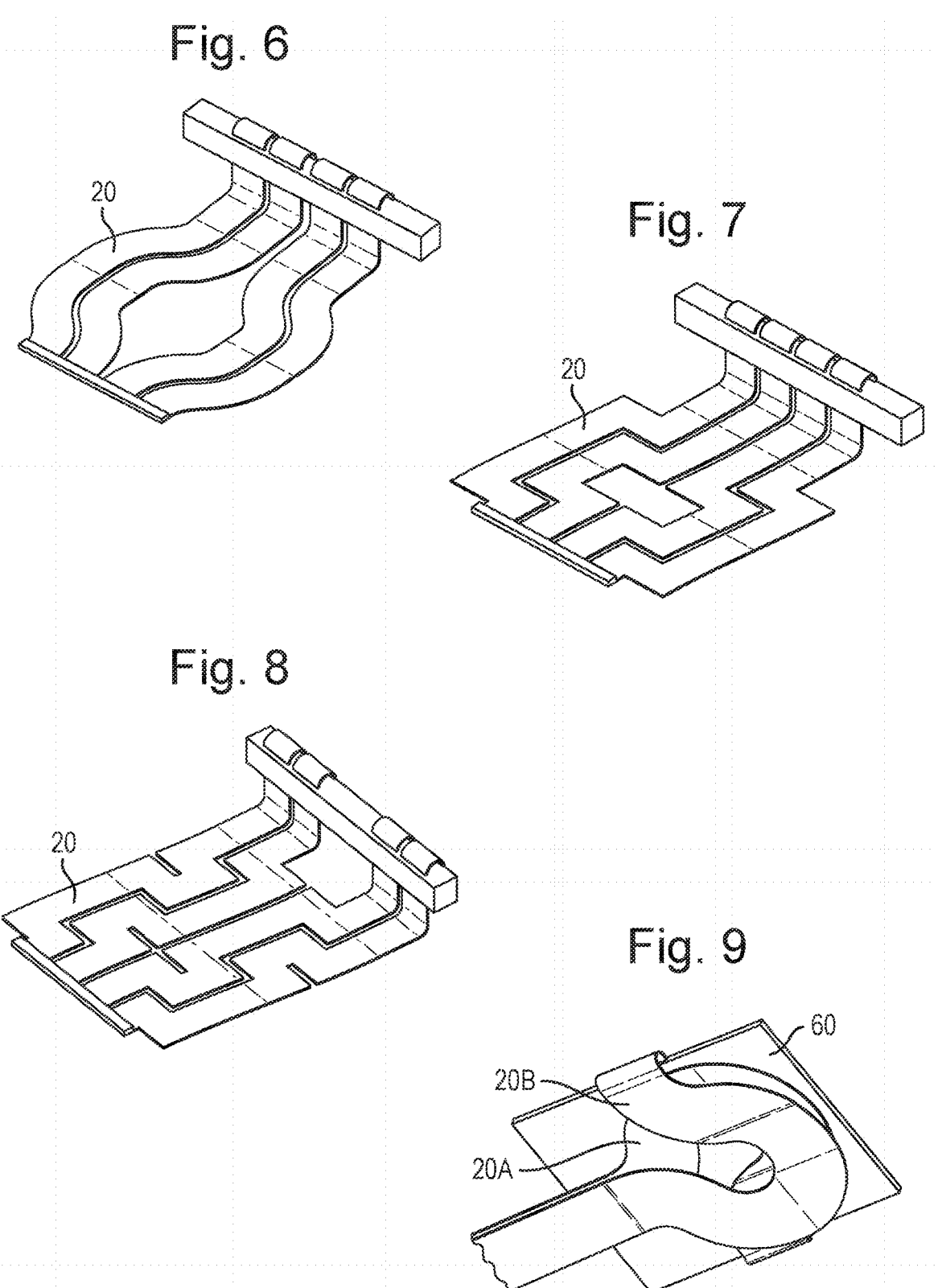
FIG. 6 is a top perspective view of a flexible connector.
FIG. 7 is a top perspective view of a flexible connector.
FIG. 8 is a top perspective view of a flexible connector.
FIG. 9 is a bottom perspective view of a flexible connector attached to a movable part.

The flexible connectors 20 of FIGS. 6 to 8 are divided into four legs.

The XY-plane bends of the legs of the flexible connector of FIG. 6 can be described as 3-point or 4-point saddle bends, or substantially U-shaped bends. The flexible connector 20 of FIG. 6, has a torsional stiffness of about 0.18 Nmm/degrees in relation to rotations of the camera module 100 about the first and/or second tilt axes within an operating range. Moreover, it has torsional stiffness of about 2.5 Nmm/degrees in relation to rotations of the camera module 100 about the primary sensor axis S.

The XY-plane bends of the legs of the flexible connector of FIG. 7 can be described as sharp-edged 3-point or 4-point saddle bends, or sharp-edged return bends. The XY-plane bends of the legs of the flexible connector of FIG. 8 can be described as sharp-edged serpentine bends.

FIG. 9 comprises two flexible connectors 20A, 20B. One flexible connector 20A extends from a first lateral side of the base 60 in a first direction and then bends around to extend in a second direction which is opposite to the first direction. The other flexible connector 20B extends from a second lateral side of the base 60 in the second direction and then bends around to extend in the first direction. The first lateral side of the base 60 is opposite the second lateral side of the base 60. The first direction and second direction are perpendicular to the primary axis P as viewed across the primary axis P.

The first portion of each flexible connector 20A, 20B comprises an XY-plane bend that could be described as being substantially questionmark-shaped and/or horseshoe-shaped. The first portion of the flexible connectors 20A, 20B substantially overlap as viewed along the primary axis P. The flexible connector 20A is substantially a horizontally or vertically flipped version of the flexible connector 20B.

Figure 10:
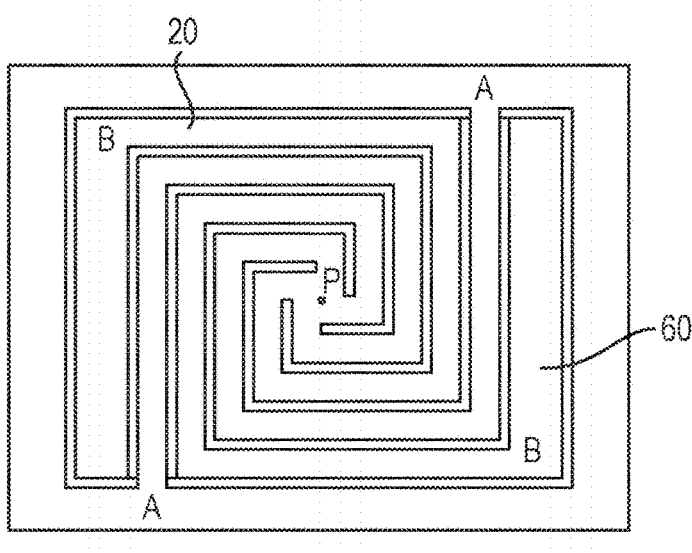
FIG. 10 is a bottom view of a flexible connector attached to a movable part.
Figure 11:
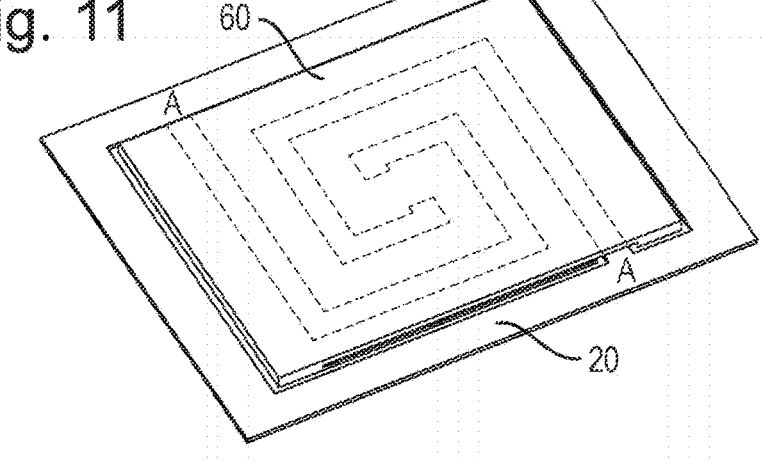
FIG. 11 is a top perspective view of in the flexible connector and movable part of FIG. 10.
Figure 12:
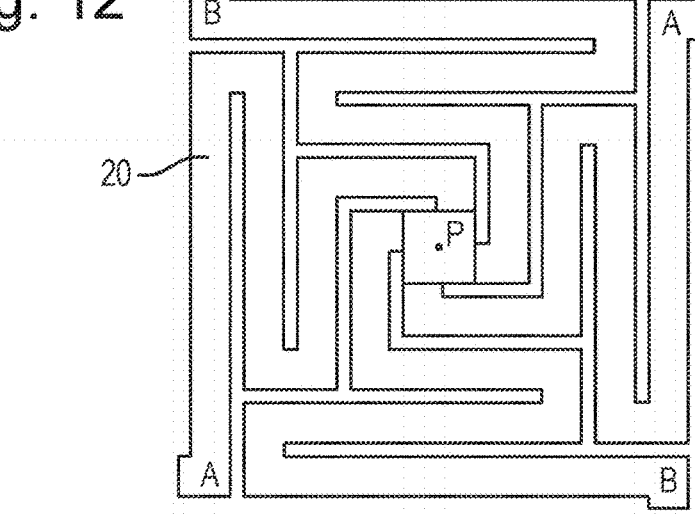
FIG. 12 is a bottom view of a flexible connector.

The flexible connectors 20 of FIGS. 10 to 12 have two legs that are connected at one end to diametrically opposed corners B of the bottom side of the base 60.

As viewed along the primary axis, the two legs of the flexible connector 20 of FIGS. 10 and 11, spiral inwards in a first sense around the primary axis P from corners B of the base 60 until the legs meet at a central part of the first portion of the flexible connector 20, and then spiral outwards in a second, opposite sense.

Figures 13, 14, 15, 16, 17, 18:
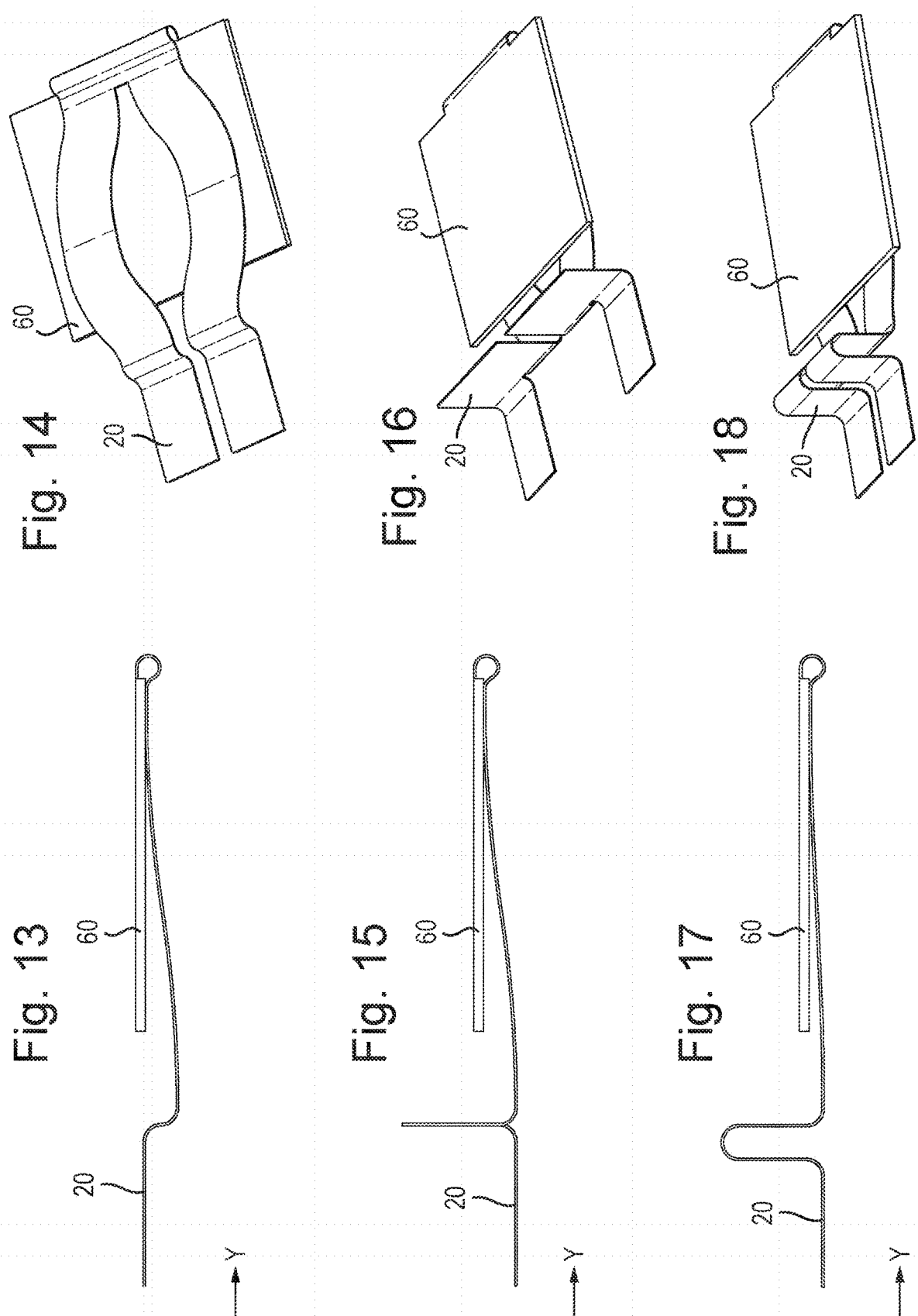
FIG. 13 is a side view of a flexible connector attached to a movable part.
FIG. 14 is a bottom perspective view of the flexible connector and movable part of FIG. 13.
FIG. 15 is a side view of a flexible connector attached to a movable part.
FIG. 16 is a top perspective view of the flexible connector and movable part of FIG. 15.
FIG. 17 is a side view of a flexible connector attached to a movable part.
FIG. 18 is a top perspective view of the flexible connector and movable part of FIG. 18.

As viewed along the primary axis, the two legs of the flexible connector 20 of FIG. 13 follow a narrowing serpentine path inwards from the corners B of the base 60 until the legs meet at a central part of the first portion of the flexible connector 20, and then follow a widening serpentine path outwards.

The flexible connectors 20 of FIGS. 10 to 12 are arranged with a two-fold rotational symmetry about the primary axis P.

Features of the Second Portion

The second portion of the flexible connectors 20 of FIGS. 13 to 22 all have one or more bends, each about an axis substantially perpendicular (e.g. perpendicular, generally perpendicular, or primarily perpendicular) to the primary axis P. These bends help reduce the torsional stiffness of the flexible connectors 20. The second portions described in relation to FIGS. 13 to 22 can be combined with any of the first portions described above in relation to FIGS. 2 to 12.

The second portion of the flexible connector 20 of FIGS. 13 and 14, as it extends from the first portion to its outer end, bends upwards and then outwards. The second portion could instead bend downwards and then outwards. The flexible connector 20 of FIGS. 13 and 14, which has the first portion of FIGS. 2 and 3, has a torsional stiffness of about 0.14 Nmm/degrees in relation to rotations of the camera module 100 about the first and/or second tilt axes within an operating range.

The second portion of the flexible connector 20 of FIGS. 15 and 16, as it extends from the first portion to its outer end, bends upwards, extends sideways, bends downwards and then bends outwards. However, the second portion could instead bend downwards, extend sideways, bend upwards and then bend outwards. The sideways extension of the second portion laterally offsets the legs of the flexible connector 20. The flexible connector 20 of FIGS. 15 and 16, which has the first portion of FIGS. 2 and 3, has a torsional stiffness of about 0.28 Nmm/degrees in relation to rotations of the camera module 100 about the first and/or second tilt axes within an operating range.

The second portion of the flexible connector 20 of FIGS. 17 and 18, as it extends from the first portion to its outer end, bends outwards after an upwards return bend (which comprises an upwards bend and then a downwards bend). However, the second portion could instead bend outwards after a downwards return bend (which comprises a downward bend and then an upward bend). The flexible connector 20 of FIGS. 17 and 18, which has the first portion of FIGS. 2 and 3, has a torsional stiffness of about 0.018 Nmm/degrees in relation to rotations of the camera module 100 about the first and/or second tilt axes within an operating range. Moreover, it has torsional stiffness of about 0.37 Nmm/degrees in relation to rotations of the camera module 100 about the primary sensor axis S.

Figure 19:
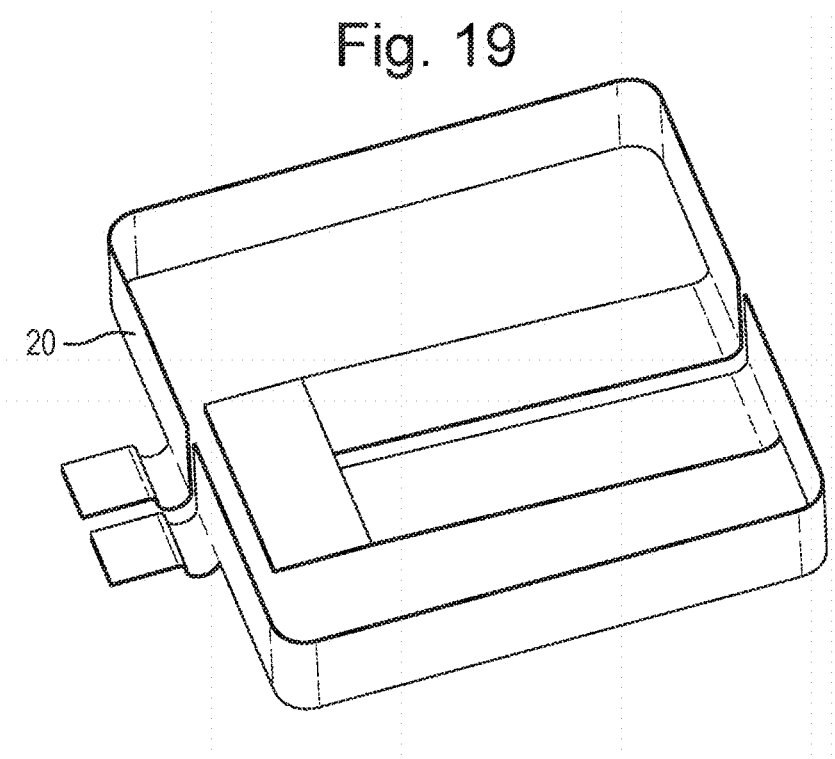
FIG. 19 is a top perspective view of a flexible connector.

The second portion of the flexible connector 20 of FIG. 19, as it extends from the first portion to its outer end, bends upwards, wraps at least partly around the periphery of the camera module 100 as viewed along the primary axis P, and then bends outwards after a downwards return bend. However, the second portion may instead have an upwards return bend, instead of a downwards return bend. The flexible connector 20 of FIG. 19 has a torsional stiffness of about 0.002 Nmm/degrees in relation to rotations of the camera module 100 about the first and/or second tilt axes within an operating range.

The camera assembly 1 may comprise a rigid printed circuit board (PCB) 40. The PCB 40 is flat and comprises two major surfaces provided on opposite sides of the PCB 40. The PCB 40 is oriented such that the major surfaces thereof are at least substantially parallel (e.g. parallel, generally parallel, or primarily parallel) to the primary axis P. The PCB 40 may be fixed to the support structure 3, for example the PCB 40 may be fixed to a lateral wall of the can 8 which is at least substantially parallel (e.g. parallel, generally parallel, or primarily parallel) to the primary axis P. The PCB 40 may be fixed to the inner or outer side of the lateral wall of the can 8, the inner side being the side facing the space enclosed by the can 8. The PCB 40 may be operatively connected to an AF drive chip (also known as an AF driver) and/or an OIS drive chip (also known as an OIS driver). The AF driver and/or the OIS driver may be mounted on the PCB 40 and/or any suitable part of the support structure 3 (e.g. the outer side of a lateral wall of the can 8).

Figure 20A:
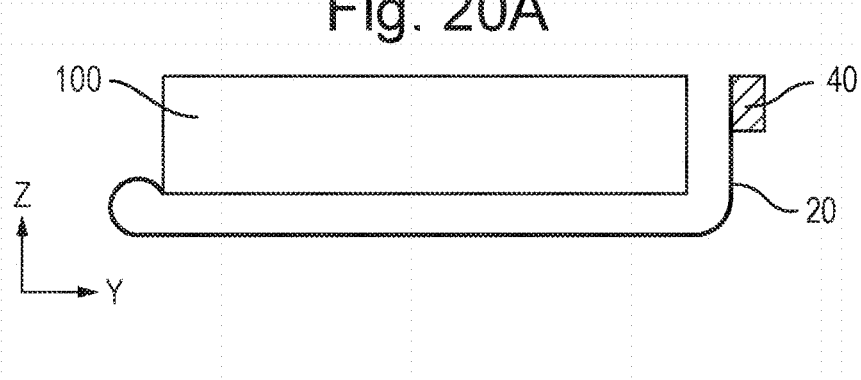
FIG. 20A is a side view of a flexible connector attached to a movable part at one end, and a printed circuit board (PCB) at another end.
Figure 20B:
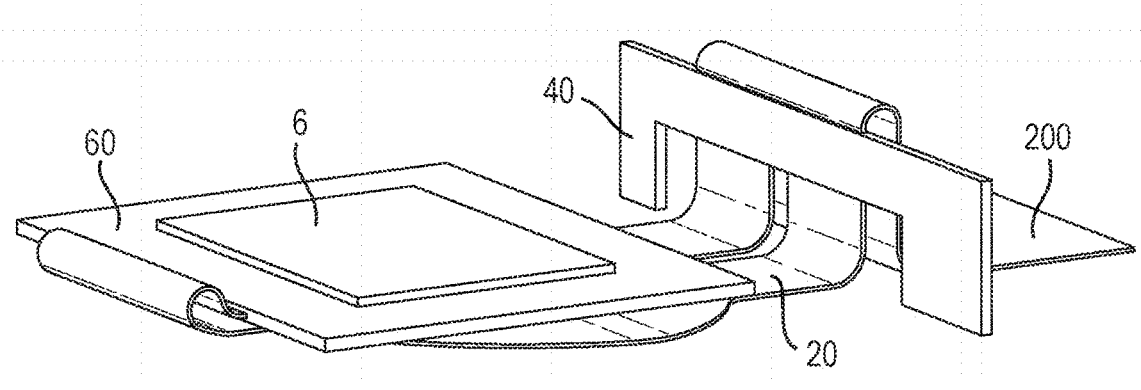
FIG. 20B is a perspective view of a flexible connector attached to a movable part at one end, and a printed circuit board (PCB) at another end.

The second portion of the flexible connector 20 of FIG. 20 (i.e. FIGS. 20A and 20B), as it extends from the first portion to its outer end, bends upwards to be operatively connected to a downwards facing surface of the PCB 40. An outer flexible connector 200, which electrically connects the PCB 40 to a component external to the camera assembly 1, extends upwards from an upwards facing surface/side of the PCB 40, and then bends outwards after a downwards return bend.

However, it will be appreciated that the second portion may instead bend downwards to be operatively connected to an upwards facing surface/side of the PCB 40, e.g. where the connection(s) to the PCB 40 is provided below the image sensor 6 with respect to the primary axis P. And that the outer flexible connector 200 may instead extend downwards from a downwards facing surface/side of the PCB 40 and then bend outwards, e.g. after an upwards return bend.

Figures 21, 22, 23:
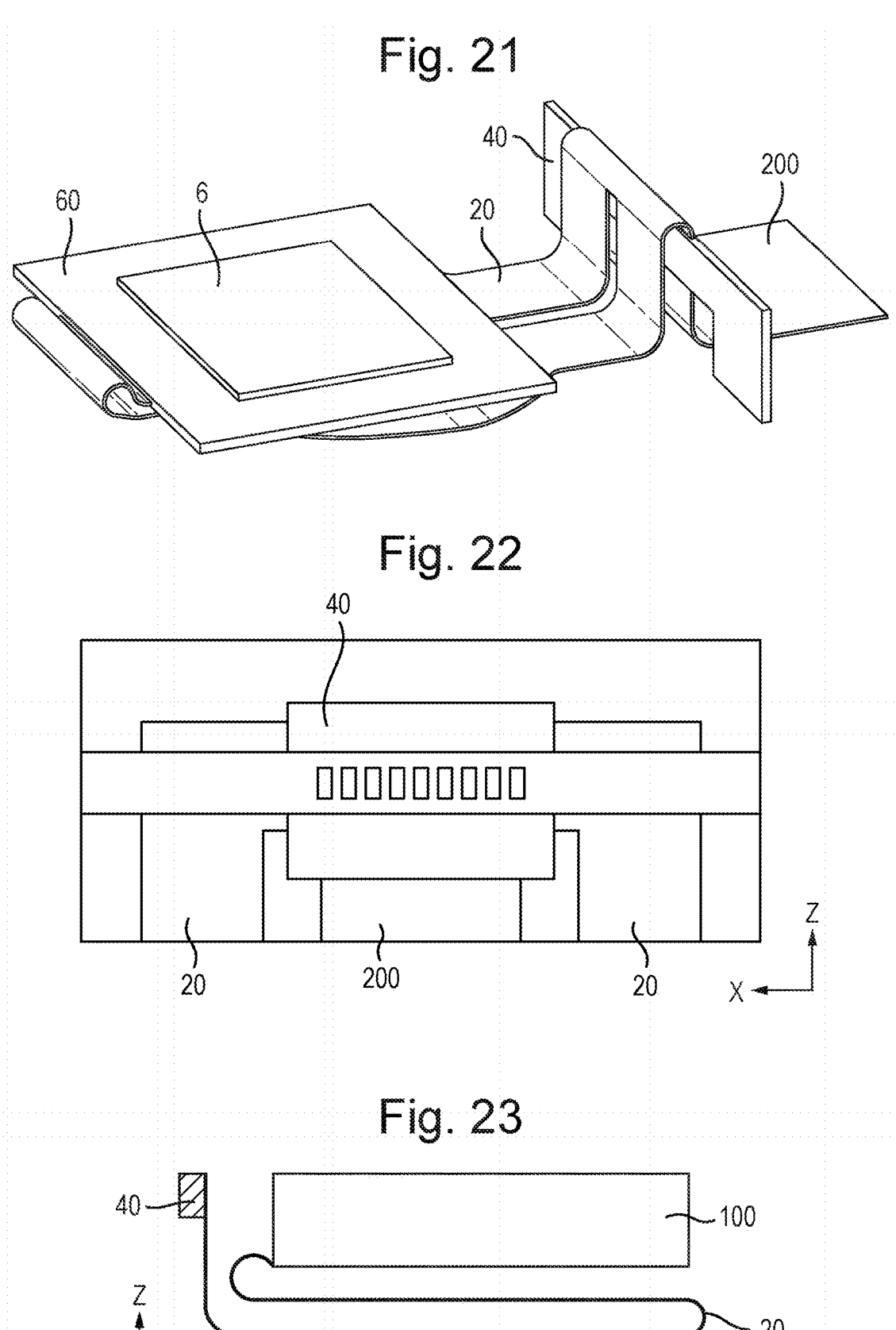
FIG. 21 is a perspective view of a flexible connector attached to a movable part at one end, and a PCB at another end.
FIG. 22 is a schematic diagram of a flexible connector attached to a PCB.
FIG. 23 is a side view of a flexible connector attached to a movable part at one end, and a printed circuit board (PCB) at another end.

The second portion of the flexible connector 20 of FIG. 21, as it extends from the first portion to its outer end, bends upwards, and then connects operatively to an upwards facing surface/side of the PCB 40 after a downwards return bend. An outer flexible connector 200 extends downwards from a downwards facing surface/side of the PCB 40, and then bends outwards.

However, it will be appreciated that the second portion may instead bend downwards, and then connect operatively to a downwards facing surface/side of the PCB 40 after an upwards return bend. And that the outer flexible connector 200 may instead extend upwards from an upwards facing surface/side of the PCB 40 and then bend outwards.

The second portion of the flexible connector 20 of FIG. 22, as it extends from the first portion to its outer end, bends upwards, and then bends sideways (i.e. in a direction at least substantially perpendicular to the primary axis P) to connect operatively to side(s) of the PCB 40. The side(s) of the PCB 40 are at least substantially parallel to the primary axis P. An outer flexible connector 200 extends downwards from a downwards facing surface/side of the PCB 40.

However, it will be appreciated that the second portion may instead bend downwards, and then bend sideways to connect operatively to side(s) of the PCB 40, e.g. where the connection(s) to the PCB 40 is provided below the image sensor 6 with respect to the primary axis P. And that the outer flexible connector 200 may instead extend upwards from an upwards facing surface/side of the PCB 40.

The above-described bends of the second portion may be provided inside the space enclosed by the can 8 of the support structure 3. The above-described bends of the second portions may be located outside the range of movement that the camera module 100 is capable of being driven over by the actuator assembly 2, so that the camera module 100 does not clash with the second portion of the flexible connector.

Further Flexible Connectors

As shown in FIGS. 30 to 33, the apparatus may comprise one or more further flexible connectors 21A, 21B each operatively connected to the PCB 40 at a first end and operatively connected to a further (rigid) PCB 400 at a second end. The further flexible connectors 21A, 21B comprise features that make it easier for the movable part 100 to rotate about the primary axis P or an axis at least substantially parallel to the primary axis P.

Where the apparatus comprises the further flexible connectors 21A, 21B and the further PCB 400, the PCB 40 may not be fixed to the support structure 3. Instead, the further PCB 400 may be fixed to the support structure 3. For example, the further PCB 400 may be fixed to a lateral wall of the can 8 which is at least substantially parallel (e.g. parallel, generally parallel, or primarily parallel) to the primary axis P. The further PCB 400 may be fixed to the inner or outer side of the lateral wall of the can 8, the inner side being the side facing the space enclosed by the can 8.

Moreover, the further PCB 400 may be operatively connected to the AF drive chip and/or an OIS drive chip. The AF drive chip and/or the OIS drive chip may be mounted on the further PCB 400 and/or any suitable part of the support structure 3 such as the outer side of a lateral wall of the can 8.

Similar to the PCB 40, the further PCB 400 is flat and comprises two major surfaces provided on opposite sides of the further PCB 400. The further PCB 400 is oriented such that the major surfaces thereof are at least substantially parallel (e.g. parallel, generally parallel, or primarily parallel) to the primary axis P.

The one or more further flexible connectors 21A, 21B may each comprise one or more bends, each about an axis substantially parallel (e.g. parallel, generally parallel, or primarily parallel) to the primary axis.

Figures 30, 31:
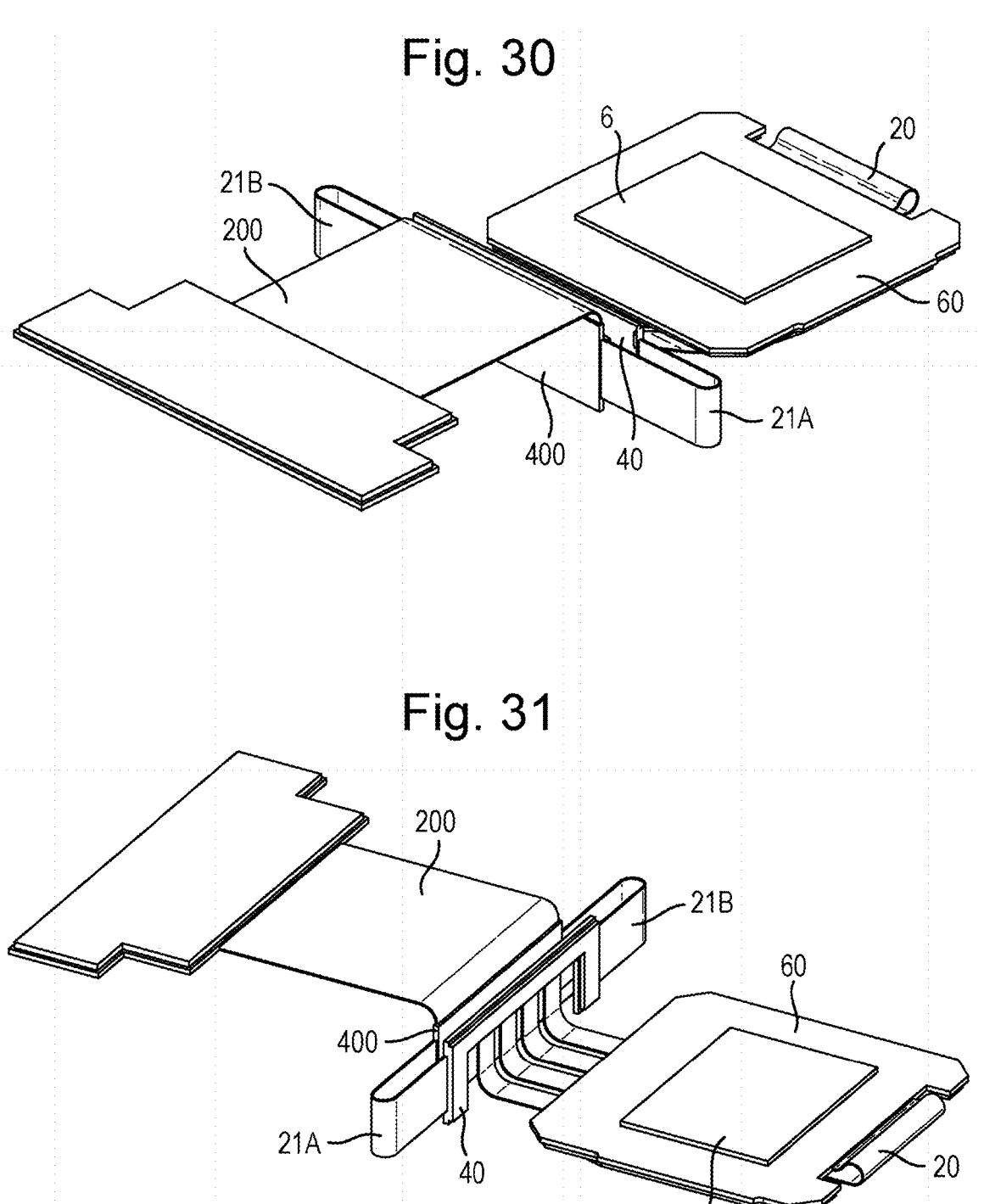
FIG. 30 is a top perspective view of an apparatus comprising a flexible connector attached to a movable part at one end and attached to a PCB at another end.
FIG. 31 is another top perspective view of the arrangement of FIG. 30.

As shown in FIGS. 30 and 31, in an embodiment, the one or more further flexible connectors 21A, 21B may comprise a first further flexible connector 21A and a second further flexible connector 21B. The further flexible connectors 21A, 21B may extend away from each other from opposite sides of the PCB 40, from sides of the PCB 40 that are parallel (or at least substantially parallel) to the primary axis P. Each further flexible connector 21A, 21B may then fold onto itself, as viewed along the primary axis P, to extend towards the further PCB 400. The second end of the further flexible connectors 21A, 21B may be connected to sides of the further PCB 400 that are parallel (or at least substantially parallel) to the primary axis P. The major surfaces of the one or more further flexible connectors 21A, 21B may be at least substantially parallel (e.g. parallel, generally parallel, or primarily parallel) to the primary axis P. The first further flexible connector 21A may be a mirrored version of the second further flexible connector 21B (and vice versa) as viewed along the primary axis P.

Figure 32:
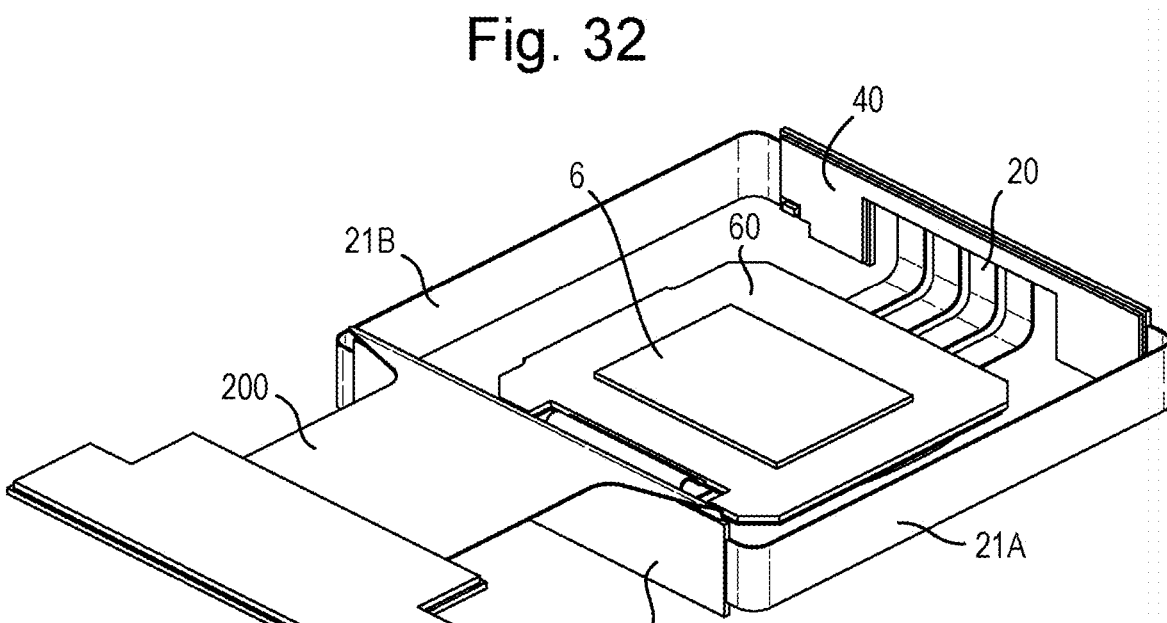
FIG. 32 is a top perspective view of an apparatus comprising a flexible connector attached to a movable part at one end and attached to a PCB at another end.
Figure 33:
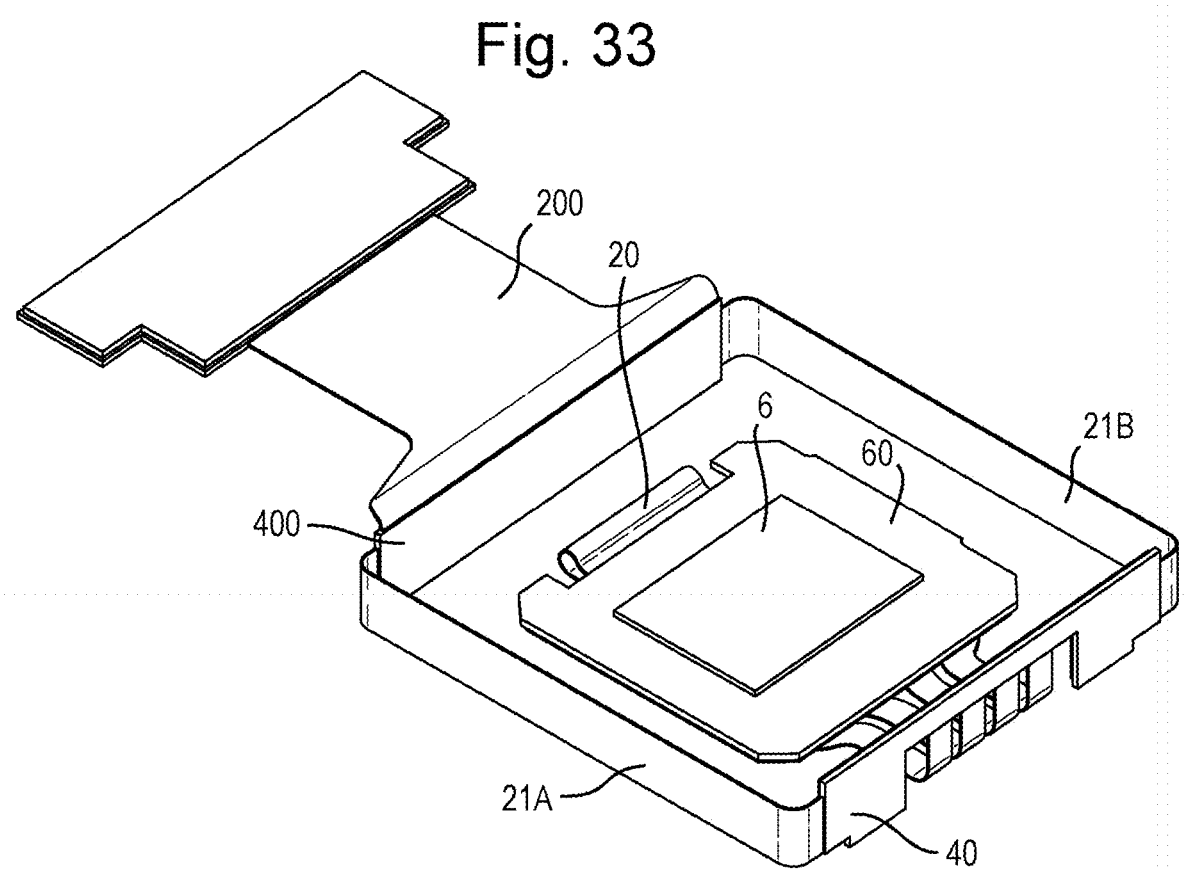
FIG. 33 is another top perspective view of the arrangement of FIG. 32.

As shown in FIGS. 32 and 33, the one or more further flexible connectors 21A, 21B may comprise a first further flexible connector 21A and a second further flexible connector 21B. The further flexible connectors 21A, 21B may extend away from each other from opposite sides of the PCB 40, from sides of the PCB 40 that are parallel (or at least substantially parallel) to the primary axis P. The further flexible connectors 21A, 21B may then wrap around the periphery of the movable part 100 as viewed along the primary axis, as they extend from the PCB 40 to the further PCB 400. The second end of the further flexible connectors 21A, 21B may be connected to sides of the further PCB 400 that are parallel (or at least substantially parallel) to the primary axis P. The major surfaces of the one or more further flexible connectors 21A, 21B may be at least substantially parallel (e.g. parallel, generally parallel, or primarily parallel) to the primary axis P. The first further flexible connector 21A may be a mirrored version of the second further flexible connector 21B (and vice versa) as viewed along the primary axis P.

As shown in FIGS. 30 to 33, where the apparatus comprises the further flexible connectors 21A, 21B and the further PCB 400, the outer flexible connector 200 may be operatively connected to the further PCB 400 instead of being operatively connected to the PCB 40. In other words, the outer flexible connector 200 may extend from the further PCB 400 instead of extending from the PCB 40.

VARIATIONS

It will be appreciated that there may be many other variations of the above-described embodiments.

For example, any of the features of the flexible connectors discussed above may in general be applied to any type of flexible connector.

For example, more or fewer bends could be introduced into the flexible connectors of FIGS. 2 to 22.

For example, the lens assembly 4 does not need to be part of the movable part 100, as moving the lens assembly 4 is not strictly required for OIS. In other words, instead of moving the camera module comprising an image sensor and a lens assembly, only the image sensor may be moved relative to the support structure and the lens assembly.

For example, the actuator assembly 2 may be configured to rotate the movable part about the first and/or second tilt axes, and may not be configured to rotate the movable part about the primary sensor axis S. Alternatively, the actuator assembly 2 may be configured to rotate the movable part about the primary sensor axis S, and may not be configured to rotate the movable part about the first and/or second tilt axes.

For example, although the flexible connectors 20 of FIGS. 10 to 12 are connected to the bottom surface of the base 60, they could instead be connected to a side of the base 60 as with the flexible connectors of FIGS. 2 to 9.

Figure 24:
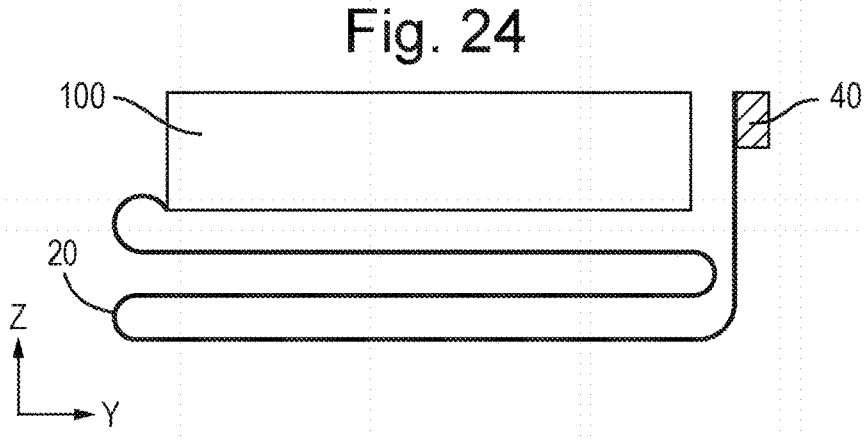
FIG. 24 is a side view of a flexible connector attached to a movable part at one end, and a printed circuit board (PCB) at another end.

For example, as shown in e.g. FIGS. 23 and 24, the first portion may comprise one or more bends (e.g. two, three or a plurality of bends), each about an axis substantially perpendicular (e.g. perpendicular, generally perpendicular, or primarily perpendicular) to the primary axis.

Figure 25:
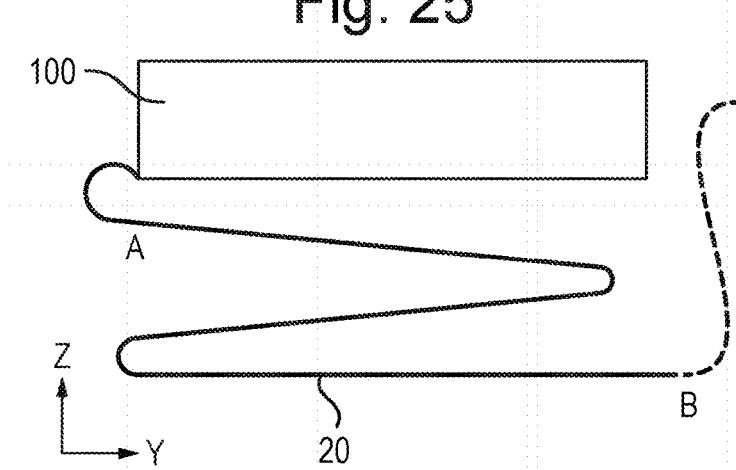
FIG. 25 is a side view of a flexible connector attached to a movable part at one end, and a printed circuit board (PCB) at another end.

For example, as shown in e.g. FIGS. 23, 24 and 25, the first portion may be folded onto itself (i.e. bent over upon itself, or folded back on itself) one or more times (e.g. two, three or a plurality of times) as viewed across the primary axis (e.g. after the first portion bends around).

Figure 26:
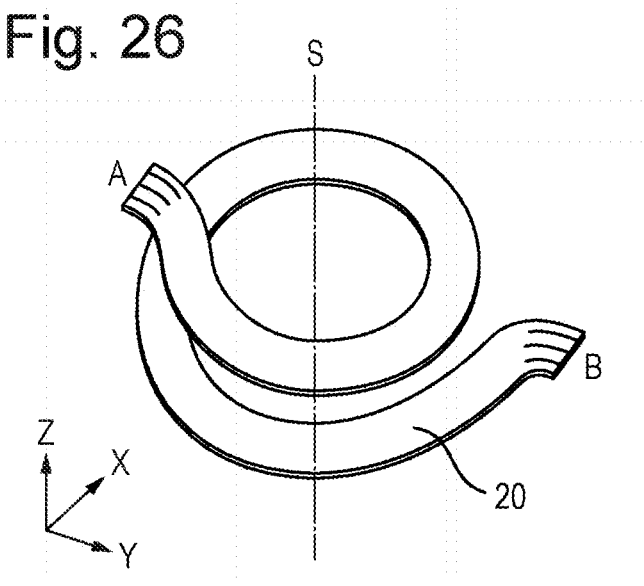
FIG. 26 is a perspective view of flexible connector of FIG. 25.

For example, as shown in e.g. FIGS. 25 and 26, the first portion may extend downwards helically around the primary axis (i.e. following a helical path extending along the primary axis) as it extends from the movable part.

Figure 27:
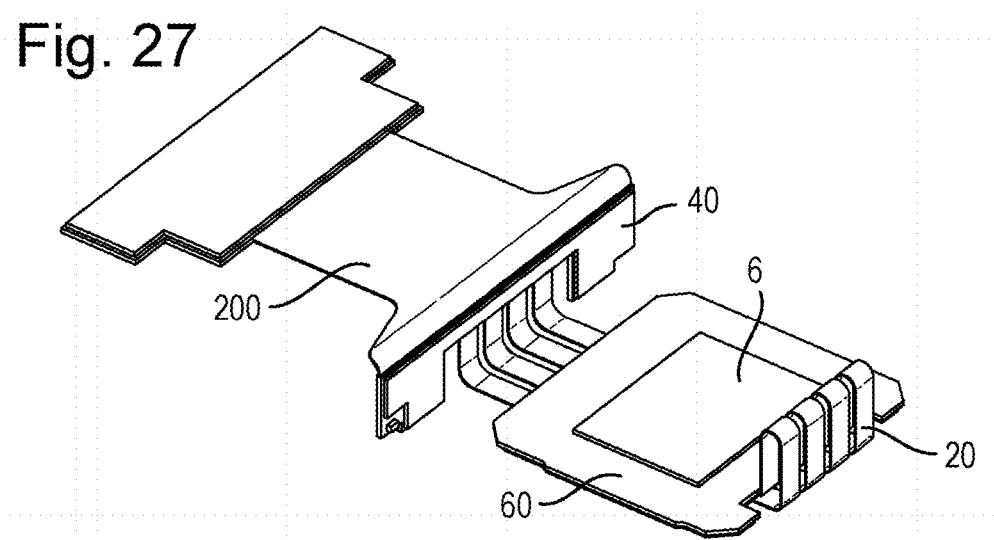
FIG. 27 is a perspective view of a flexible connector attached to a movable part at one end, and a printed circuit board (PCB) at another end.

For example, as shown in e.g. FIGS. 20A, 20B, 21, 23, 24, 27, 28 and 29, the first portion, as it extends from the movable part, may bend upwards and then downwards before extending below the electronic component. As shown in FIG. 27, the first portion may extend upwards by a significant amount.

Figure 28:
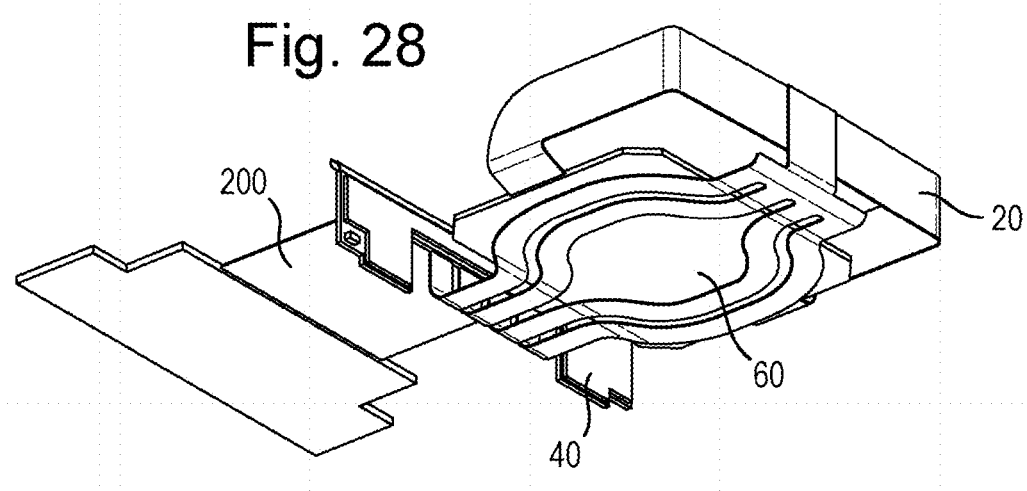
FIG. 28 is a bottom perspective view of a flexible connector attached to a movable part at one end, and a printed circuit board (PCB) at another end.
Figure 29:
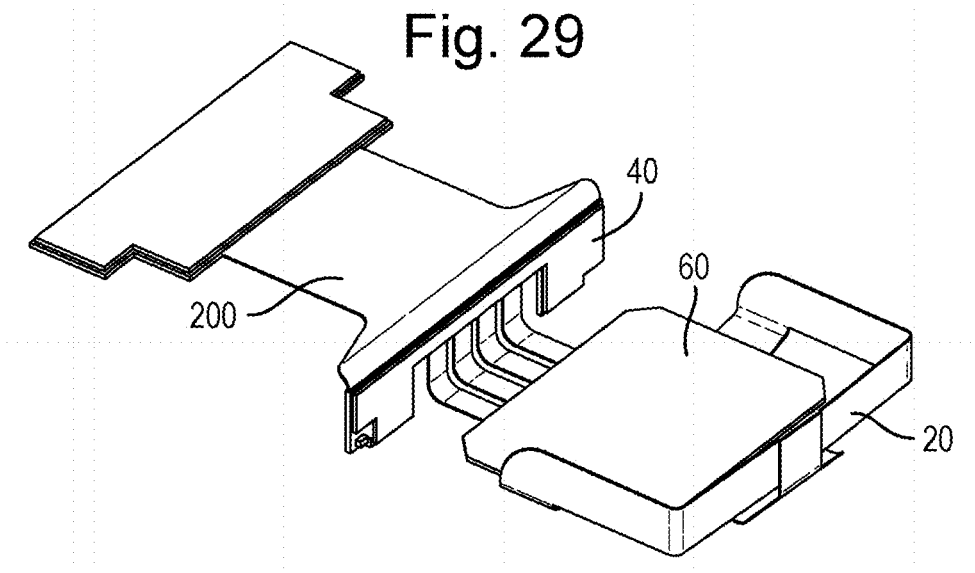
FIG. 29 is a top perspective view of the arrangement shown in FIG. 28.

For example, as shown in e.g. FIGS. 28 and 29, the first portion may extend from one or more sides (e.g. two opposite sides) of the movable part (away from the primary axis), bend upwards (generally parallel to the primary axis), wrap at least partly around the periphery of the movable part as viewed along the primary axis (i.e. wraps around the periphery of the movable part around the primary axis), and then bend downwards (generally parallel to the primary axis) and inwards (i.e. towards the primary axis) to pass between the movable part and the support structure, below the image sensor with respect to the primary axis.

As shown in FIGS. 28 and 29, the first portion may comprise two arms that extend from two opposite sides of the movable part. Each arm extends from a side of the movable part, bends upwards, wraps at least partly around the periphery of the movable part as viewed along the primary axis, and then bends downwards and inwards to pass between the movable part and the support structure, below the image sensor with respect to the primary axis. The arms may join after wrapping around the movable part and before bending downwards and inwards to pass between the movable part and the support structure, below the image sensor with respect to the primary axis.

Any of the flexible connectors described herein may be used with any apparatus in which an electronic component (e.g. a display, an emitter, or a part thereof) is to be moved with respect to a support structure.

Any of the first portions of FIGS. 2 to 12 and 23 to 29, may be combined with any of the second portions of FIGS. 13 to 22, and may be further combined with any of the further flexible connectors of FIGS. 30 to 33.

Any of the features of the first portions may be combined together. For example, the first portion may be provided with a combination of at least some of the features of FIGS. 23 and 6. For example, the first portion may be provided with a combination of at least some of the features of FIGS. 19 and 6.

Also disclosed is:

1. A camera assembly comprising:
   a support structure;
   a movable part comprising an image sensor;
   a lens assembly positioned above the image sensor with respect to a primary axis, wherein the primary axis is defined with reference to the support structure and passes through the image sensor;
   an actuator assembly configured to move the movable part relative to the support structure; and
   a flexible connector for making electrical connections to the image sensor, wherein the flexible connector comprises:
      a first portion connected at one end to the movable part and passing between the movable part and the support structure, below the image sensor with respect to the primary axis; and
      a second portion extending from the first portion, and located outside the footprint of the movable part as viewed along the primary axis; and
   wherein, in order to reduce the torsional stiffness of the flexible connector:
      the first portion comprises one or more bends, each about an axis substantially parallel to the primary axis; and/or
      the second portion comprises one or more bends, each about an axis substantially perpendicular to the primary axis.
2. A camera assembly according to item 1, wherein the first portion comprises: a first bend about an axis substantially parallel to the primary axis, and a second bend about another axis substantially parallel to the primary axis; wherein the first and second bends bend about their respective axes in opposite senses.
3. A camera assembly according to items 1 or 2, wherein the second portion comprises two bends, each about an axis substantially perpendicular to the primary axis.
4. A camera assembly according to any preceding item, wherein the lens assembly is comprised in the movable part.

5. A camera assembly according to any preceding item, wherein:
   the actuator assembly is configured to rotate the movable part about a first and/or second axes, wherein the first and second axes are perpendicular to each other and to the primary axis; and
   the flexible connector has a stiffness of less than 0.64 Nmm/degree in relation to rotations of the movable part about the first and/or second axes within an operating range.
6. A camera assembly according to any preceding item, wherein:
   the actuator assembly is configured to rotate the movable part about the primary axis and/or about an optical axis of the lens assembly; and
   the flexible connector has a stiffness of less than 4.5 Nmm/degree in relation to rotations of the movable part about the primary axis and/or the optical axis within an operating range.
7. A camera assembly according to any preceding item, wherein at least part of the flexible connector is divided into a plurality of legs.
8. A camera assembly according to item 7, wherein the plurality of legs comprises a first leg and a second leg, and wherein the first leg is substantially a horizontally or vertically flipped version of the second leg as viewed along the primary axis.
9. A camera assembly according to any preceding item, wherein, as the first portion passes between the movable part and the support structure, below the image sensor with respect to the primary axis, the major surfaces of the first portion are substantially perpendicular to the primary axis.
10. A camera assembly according to any preceding item, wherein the first portion extends from the movable part in a first direction and then bends around to extend in a second direction which is substantially opposite to the first direction.
11. A camera assembly according to item 10 when dependent on item 7 or 8, wherein the flexible connector is divided into the plurality of legs after it bends around to extend in the second direction.
12. A camera assembly according to any preceding item, wherein, as viewed along the primary axis, the first portion extends in a serpentine manner.
13. A camera assembly according to any preceding item, wherein, as viewed along the primary axis, the first portion follows a narrowing serpentine path inwards and then follows a widening serpentine path outwards.
14. A camera assembly according to any of items 1 to 11, wherein, as viewed along the primary axis, the first portion spirals inward in a first sense around the primary axis or an axis parallel thereto, and then spirals outward in a second, opposite sense.
15. A camera assembly according to any preceding item, wherein, as the first portion extends from the movable part to the second portion, the first portion slopes downward.
16. A camera assembly according to any preceding item, wherein, as the second portion extends from the first portion to its outer end, the second portion bends upwards or downwards, and then bends outwards.
17. A camera assembly according to any preceding item, wherein, as the second portion extends from the first portion to its outer end, the second portion bends upwards, bends downwards and then bends outwards.

18. A camera assembly according to item 17, wherein the second portion extends sideways between the upwards and downwards bends.

19. A camera assembly according to any of items 1 to 17, wherein, as the second portion extends from the first portion to its outer end, the second portion bends outwards after an upwards or downwards return bend.

20. A camera assembly according to any preceding item, wherein the second portion bends upwards, wraps at least partly around the periphery of the movable part as viewed along the primary axis, and then bends outwards after a downwards return bend.

21. A camera assembly according to any preceding item, comprising a printed circuit board (PCB) to which the second portion is operatively connected, wherein the PCB is oriented such that the major surfaces thereof are substantially parallel to the primary axis.

22. A camera assembly according to item 21, wherein, as the second portion extends from the first portion to its outer end, the second portion bends upwards and then is connected to the PCB.

23. A camera assembly according to item 22, wherein, after bending upwards, the second portion bends downwards to connect to the PCB.

24. A camera assembly according to item 22, wherein, after bending upwards, the second portion bends sideways to connect to the PCB.

25. A camera assembly according to any preceding item, wherein the actuator assembly comprises one or more shape memory alloy (SMA) wires operatively connected between the support structure and the movable part.

26. A camera assembly according to item 25, wherein the actuator assembly comprises eight SMA wires divided in two groups of four SMA wires, and wherein:
the two SMA wires are located on each of four sides around the primary axis, the four sides extending in a loop around the primary axis;
the two SMA wires on each of the four sides are inclined with respect to the primary axis;
the SMA wires of each of the two groups of four SMA wires are arranged with a 2-fold rotational symmetry about the primary axis; and
one of the two groups of four SMA wires provides a force on the movable part with a component in a first direction along the primary axis and the other of the two groups of four SMA wires provides a force on the movable part with a component in a second direction along the primary axis, opposite to the first direction along the primary axis.

27. A camera assembly according to item 25, wherein:
the movable part is movable relative to the support structure across a range of movement in two orthogonal directions perpendicular to the primary axis; and
the actuator assembly comprises four SMA wires, wherein none of the SMA wires are collinear and the SMA wires are capable of being selectively driven to move the movable part relative to the support structure to any position in said range of movement without applying any net torque to the movable part in the plane of the two orthogonal directions around the primary axis.

28. A camera assembly according to item 25, wherein the actuator assembly comprises four SMA wires and a biasing element arranged to resist translation of the movable part in a plane perpendicular to the primary axis.

The invention claimed is:

1. An apparatus comprising:
a support structure;
a movable part comprising an electronic component, wherein a primary axis is defined with reference to the support structure and passes through the electronic component;
an actuator assembly configured to move the movable part relative to the support structure; and
a flexible connector for making electrical connections to the electronic component, wherein the flexible connector comprises:
a first portion connected at one end to the movable part and passing between the movable part and the support structure, below the electronic component with respect to the primary axis; and
a second portion extending from the first portion, and located outside the footprint of the movable part as viewed along the primary axis;
wherein, in order to reduce the torsional stiffness of the flexible connector,
the first portion comprises a plurality of legs, each of the plurality of legs having one or more bends, each about an axis at least substantially parallel to the primary axis; and
wherein the second portion comprises one or more bends, each about an axis at least substantially perpendicular to the primary axis.

2. The apparatus according to claim 1, wherein:
the first portion comprises a first bend about an axis at least substantially parallel to the primary axis, and a second bend about another axis at least substantially parallel to the primary axis; and
the first and second bends bend about their respective axes in opposite senses.

3. The apparatus according to claim 1, wherein the second portion comprises two bends, each about an axis at least substantially perpendicular to the primary axis.

4. The apparatus according to claim 1, wherein:
the actuator assembly is configured to rotate the movable part about at least one of the primary axis, a first axis, or a second axis;
the first and second axes are perpendicular to each other and to the primary axis; and
the flexible connector has at least one of a stiffness of less than 0.64 Nmm/degree in relation to rotations of the movable part about the first axis and/or the second axis within an operating range or a stiffness of less than 4.5 Nmm/degree in relation to rotations of the movable part about the primary axis within an operating range.

5. The apparatus according to claim 1, wherein the plurality of legs comprises a first leg and a second leg, and wherein the first leg is a mirrored version of the second leg as viewed along the primary axis.

6. The apparatus according to claim 1, wherein, as the first portion passes between the movable part and the support structure, below the electronic component with respect to the primary axis, major surfaces of the first portion are at least substantially perpendicular to the primary axis.

7. The apparatus according to claim 1, wherein the first portion generally extends from the movable part in a first direction and then bends around to generally extend in a second direction opposite to the first direction.

8. The apparatus according to claim 7, wherein at least part of the flexible connector is divided into a plurality of legs after it bends around to extend in the second direction.

9. The apparatus according to claim 1, wherein, as the first portion extends from the movable part to the second portion, the first portion slopes downward.

10. The apparatus according to claim 1, wherein, as the second portion extends from the first portion to its outer end, the second portion bends upwards or downwards, and then bends outwards.

11. The apparatus according to claim 1, wherein:

as the second portion extends from the first portion to its outer end, the second portion bends upwards, bends downwards, and then bends outwards; and the second portion extends sideways between the upwards and downwards bends.

12. The apparatus according to claim 1, wherein, as the second portion extends from the first portion to its outer end, the second portion bends outwards after an upwards or downwards return bend.

13. The apparatus according to claim 1, wherein the second portion bends upwards, wraps at least partly around the periphery of the movable part as viewed along the primary axis, and then bends outwards after a downwards return bend.

14. The apparatus according to claim 1, comprising a printed circuit board (PCB) to which the second portion is operatively connected to, wherein the PCB is oriented such that major surfaces thereof are at least substantially parallel to the primary axis.

15. The apparatus according to claim 14, comprising one or more further flexible connectors each operatively connected to the PCB at a first end and operatively connected to a further PCB at a second end.

16. The apparatus according to claim 15, wherein the one or more further flexible connectors each comprise one or more bends, each about an axis at least substantially parallel to the primary axis.

17. The apparatus according to claim 1, wherein the actuator assembly comprises one or more shape memory alloy (SMA) wires operatively connected between the support structure and the movable part.

18. The apparatus according to claim 1, wherein the electronic component defines a plane and the primary axis is perpendicular to the plane.

19. The apparatus according to claim 1, wherein the first portion at least one of:

comprises one or more bends, each about an axis at least substantially perpendicular to the primary axis, is folded onto itself one or more times as viewed across the primary axis, extends downwards helically around the primary axis, or as it extends from the movable part, bends upwards and then downwards before extending below the electronic component.

20. The apparatus according to claim 1, wherein:

the electronic component comprises an image sensor comprising a light-sensitive region;

the primary axis is perpendicular to the light-sensitive region; and as the first portion extends from the movable part to the second portion, the first portion extends from one or more sides of the movable part, bends upwards, wraps at least partly around the periphery of the movable part as viewed along the primary axis, and then bends downwards and inwards to pass between the movable part and the support structure, below the image sensor with respect to the primary axis.

* * * * *